United States Patent [19]
Denda

[11] Patent Number: 5,006,731
[45] Date of Patent: Apr. 9, 1991

[54] THREE STATE EMITTER COUPLED LOGIC CIRCUIT WITH A SMALL AMOUNT OF CURRENT CONSUMPTION

[75] Inventor: Akira Denda, Tokyo, Japan

[73] Assignee: NEC Corporation, Tokyo, Japan

[21] Appl. No.: 416,116

[22] Filed: Oct. 2, 1989

[30] Foreign Application Priority Data

Oct. 6, 1988 [JP] Japan .................... 63-252681

[51] Int. Cl.$^5$ ............ H03K 19/02; H03K 3/01; H03K 17/60
[52] U.S. Cl. ................. 307/455; 307/446; 307/473; 307/296.3; 307/570
[58] Field of Search ............. 307/443, 446, 455, 570, 307/473, 296.3

[56] References Cited

U.S. PATENT DOCUMENTS 4,623,802  11/1986  Cline et al. .................. 307/455

Primary Examiner—Stanley D. Miller
Assistant Examiner—Margaret Rose Wambach
Attorney, Agent, or Firm—Helfgott & Karas

[57] ABSTRACT

A three state emitter coupled logic circuit has a logic circuit responsive to an input logic signal and a three state control signal, a difference circuit formed by two series combination of resistors and bipolar transistors coupled in parallel as well as a constant current source coupled between the difference circuit and a constant source, and an emitter follower circuit coupled to an intermediate node between one of the resistors and one of the bipolar transistors for producing an output signal, and a bypassing circuit is provided in parallel to the constant current source for increasing the amount of current passing through the difference circuit in the presence of the three state control signal of the active level, so that the voltage level at the intermediate node is varied out of the usual voltage range for the logic function mode, thereby the three state emitter coupled logic circuit being established in the high impedance state.

8 Claims, 5 Drawing Sheets

THREE STATE EMITTER COUPLED LOGIC CIRCUIT WITH A SMALL AMOUNT OF CURRENT CONSUMPTION

FIELD OF THE INVENTION

This invention relates to a three state emitter coupled logic circuit and aims at reduction in current consumption of the three state emitter coupled logic circuit.

DESCRIPTION OF THE RELATED ART

When an electronic system is comprised of a lot of logic circuits communicable with one another through a bus system, it is necessary that each of the logic circuits should not only be responsive to input signals of high and low voltage levels for a certain logic function but also be inactive to the input signals supplied to other logic circuits. For this reason, the logic circuit incorporated in such an electronic system is usually a three state logic circuit, and a highimpedance state is established in the presence of a three-stage control signal.

A typical example of a three state emitter coupled logic circuit is illustrated in FIG. 1 of the drawings, which circuit largely comprises two difference circuits 1 and 2, a control circuit formed by an AND gate 3, and an output circuit 4. A logic signal LG and a three state control signal CNT are supplied to the respective input nodes of the AND gate 3, and only the three state control signal CNT is further fed to the difference circuit 2.

The difference amplifier circuit 1 comprises two series combinations of resistors R1 and R2 and n-p-n type bipolar transistors Q1 and Q2 coupled in parallel between the ground node and a common node 5, and a series combination of an n-p-n type bipolar transistor Q3 and a resistor R3 coupled between the common node 5 and a negative constant voltage source Vee. The AND gate 3 is coupled to the base node of the n-p-n bipolar transistor Q1 serving as an input node of the difference circuit 1, and an output node of the difference circuit 1 is provided between the resistor R2 and the n-p-n type bipolar transistor Q2. The n-p-n bipolar transistor Q2 has a base node coupled to a reference voltage source Vref, and the n-p-n bipolar transistor Q3 is supplied at the base node with a current source signal Vcs. The n-p-n type bipolar transistor Q3 serves as a constant current source, and, accordingly a difference function takes place between the two n-p-n bipolar transistors Q1 and Q2.

The second difference circuit 2 largely comprises two n-p-n bipolar transistors Q4 and Q5 respectively coupled between the ground node and a common node 6 and between the output node of the first difference circuit 1 and the common node 6, and a series combination of an n-p-n bipolar transistor Q6 and a resistor R4 coupled between the common node 6 and the negative constant voltage source Vee. The n-p-n bipolar transistor Q5 is coupled at the base node thereof to the reference voltage source Vref, and the base node of the n-p-n bipolar transistor Q6 is supplied with the current source signal Vcs. The second difference circuit 2 thus arranged behaves as a current switching circuit.

The output circuit 4 is formed by a series combination of an n-p-n bipolar transistor Q7, an output node 7 and a resistor R5 coupled between the ground node and a bit line 8 which forms part of a multi-bit bus system, and the output circuit 4 is formed as an emitter follower.

With the logic signal LG and the three state control signal CNT, the prior art three state emitter coupled logic circuit operates as follows:

Assuming now that the three state control signal CNT is at the high voltage level and that the current source signal Vcs remains at the high voltage level, the n-p-n bipolar transistor Q4 fully turns on and permits the n-p-n bipolar transistor Q5 to remain in the off state. This results in that the second difference circuit 2 or the current switching circuit blocks a current path between the output node of the first difference circuit 1 and the negative constant voltage source Vee, and the output circuit 4 is affected by the first difference circuit 1 only.

In this situation, if the logic signal LG goes up to the high voltage level, the three state control signal CNT of the high voltage level is ANDed with the logic signal LG of the high voltage level, and the AND gate 3 supplies the output signal of the high voltage level to the n-p-n bipolar transistor Q1 of the first difference amplifier circuit 1. Since the n-p-n bipolar transistors Q3 has already turned on with the current source signal Vcs of the high voltage level, the n-p-n bipolar transistor Q1 supplies the n-p-n bipolar transistor Q3 with most of the current passing therethrough, and, for this reason, the n-p-n bipolar transistor Q2 substantially turns off to cut off a current path between the output node of the first difference circuit Q1 and the constant current source or the n-p-n bipolar transistor Q3. When the n-p-n bipolar transistor Q2 turns off, the high voltage level or the ground voltage level is supplied to the base node of the n-p-n bipolar transistor Q2 so as to allow turning on. The collector current passing through the bipolar transistor Q7 is about 20 milli-ampere, and the output node 7 goes up to about −0.9 volt or the high voltage level. However, if the logic signal LG goes down to the low or negative voltage level, the n-p-n bipolar transistor Q1 turns off, but the n-p-n bipolar transistor Q2 is allowed to turn on. The output node of the first difference circuit 1 is coupled to the constant voltage source Vee through the n-p-n bipolar transistors Q2 and Q3, and the negative voltage level appears at the output node. This results in that the n-p-n bipolar transistor Q7 decreases the collector current to about 5 milli-ampere, and, for this reason, the output node 7 goes down to about −1.7 volt or the low voltage level. Thus, the logic signal LG is transferred from the AND gate 3 to the output node 7 without any alternation in logic level insofar as the three state control signal CNT activates the logic circuit, and, accordingly, the first difference circuit 1 and the output circuit 4 achieves the non-inverted logical function when the logic signal LG is supplied thereto However, if the three state control signal CNT goes down to the inactive low voltage level, the AND gate does not respond to the logic signal LG and supplies the low or negative voltage level to the n-p-n bipolar transistor Q1. This results in that the n-p-n bipolar transistor Q1 turns to the off state which allows the n-p-n type bipolar transistor Q2 to turn on. With the three state control signal CNT of the low voltage level, the n-p-n bipolar transistor Q4 turns off, but a difference in the voltage level between the emitter and base nodes of the n-p-n bipolar transistor Q6 is increased. The increased difference in the voltage level allows the n-p-n bipolar transistor Q6 to turn on so that the output node of the first difference circuit 1 is coupled to the constant voltage source Vee through the n-p-n bipolar transistors Q5 and Q6. The output node of the first difference circuit 1 is thus coupled to the constant voltage source Vee through two current paths, i.e., through the n-p-n bipolar transistors Q2 and Q3 and through the n-p-n bipolar transistors Q5 and Q6, and, for this reason, the output node of the first difference circuit 1 further goes down in the negative direction. The output node of the first difference circuit 1 finally reaches a certain voltage level which is lower than the total sum of the forward biasing voltage level of the n-p-n bipolar transistor Q7 and the end voltage level Vt. Such a low voltage level surely confines the n-p-n bipolar transistor Q7 in the off state, and establishes the output node 7 in the high impedance state.

The prior art three state emitter coupled logic circuit is responsible to the three state control signal CNT and can to form a part to the electronic system where the bus system is used for the data communication. However, a problem is encountered in the prior art three state emitter coupled logic circuit in that a large amount of current is consumed therein. This is because of the fact that the second difference circuit 2 allows a current to flow through the n-p-n bipolar transistors Q4 and Q6 in the non-high impedance state.

Moreover, the prior art three state emitter coupled logic circuit has a further problem in the occupation area. Since the second difference circuit 2 is constituted by three n-p-n bipolar transistors Q4, Q5 and Q6 and one resistor R4 associated with the negative constants voltage source Vee and the current source signal Vcs, a large amount of the occupation area is consumed by the component elements per se and by conductive wirings interconnecting the component elements Q4 to Q6 and R4. The large occupation area is not desirable for fabricating an integrated circuit.

SUMMARY OF THE INVENTION

It is therefore an important object of the present invention to provide a three state emitter coupled logic circuit which merely consumes a small amount of current in the logic operation.

It is also an important object of the present invention to provide a three state emitter coupled logic circuit which is desirable for an integrated circuit, because of a simple circuit arrangement.

To accomplish these objects, the present invention proposes to increase the current flowing through a difference circuit for decreasing the voltage level supplied to an output circuit, thereby establishing a three state emitter coupled logic circuit into a high impedance state.

In accordance with the present invention, there is provided a three state emitter coupled logic circuit shifted between a logical function mode and a high impedance state, comprising: (a) a logic circuit responsive to an input logic signal and a three state control signal and operative to produce an internal logic signal; (b) a difference circuit having a first series combination of a first resistor and a first bipolar transistor coupled between a first constant voltage source and a common node, a second series combination of a second resistor and a second bipolar transistor coupled in parallel to the first series combination between the first constant voltage source and the common node, a third series combination of a third bipolar transistor and a third resistor coupled between the common node and a second constant voltage source, the first, second and third bipolar transistors being supplied at the respective base nodes thereof with the internal logic signal, a reference voltage level and a current source signal, respectively; c) an output circuit having a fourth series combination of a fourth bipolar transistor, an output node and a fourth resistor coupled between the first constant voltage source and an output signal line, the fourth bipolar transistor being coupled at the base node thereof to an intermediate node provided between the second resistor and the second bipolar transistor; and d) a bypassing circuit providing a current path bypassing the third resistor in the presence of the three state control signal of an active voltage level for establishing the three state emitter coupled logic circuit in the high impedance state, the current path being blocked in the presence of the three state control signal of an inactive voltage level for establishing the three state emitter coupled logic circuit in the logic function mode

BRIEF DESCRIPTION OF THE DRAWINGS

The features and advantages of a three state emitter coupled logic circuit according to the present invention will be more clearly understood from the following description taken in conjunction with the accompanying drawings in which.

DESCRIPTION OF THE PREFERRED EMBODIMENTS

Figure 1:
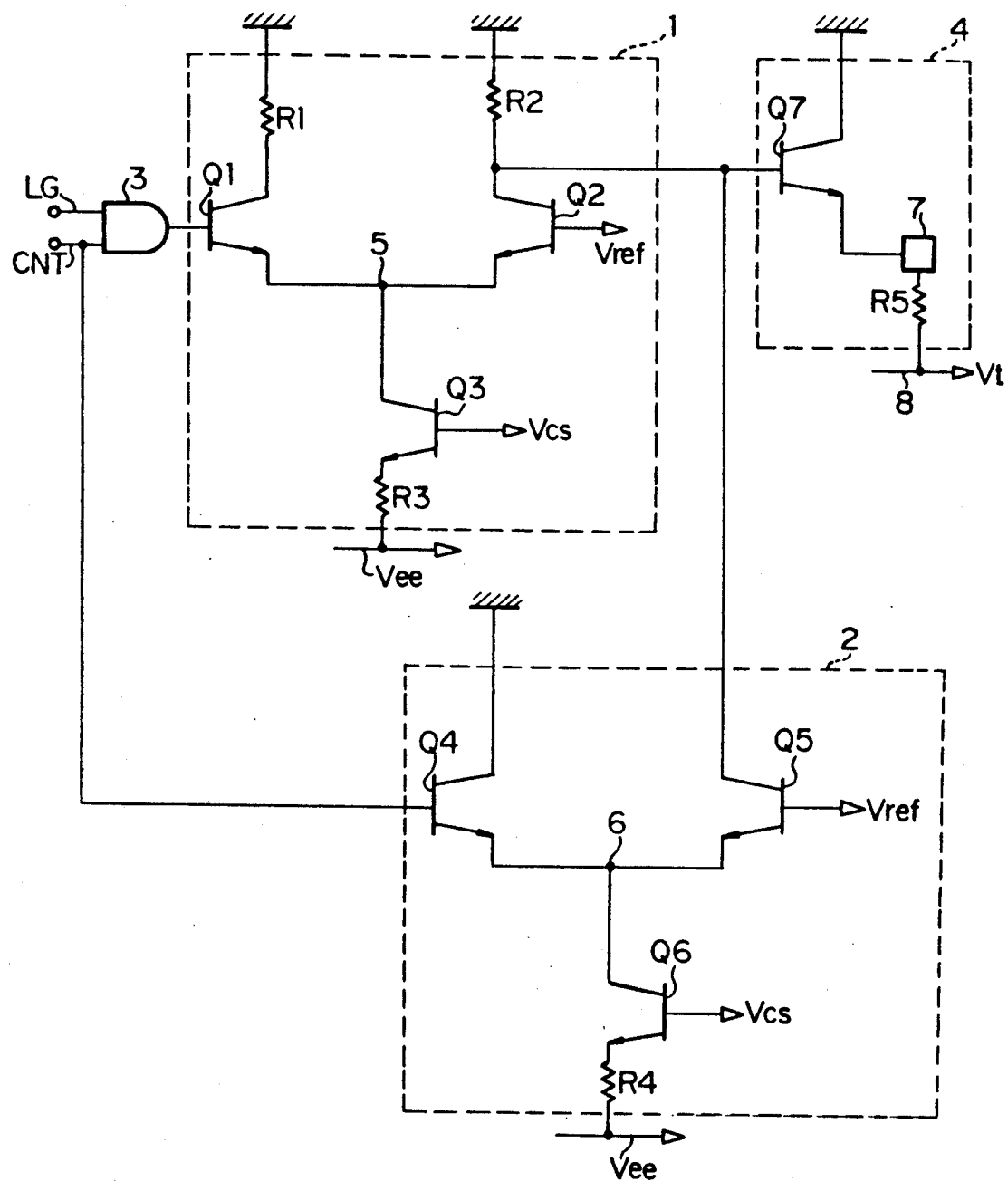
FIG. 1 is a circuit diagram showing the arrangement of a prior art three state emitter coupled logic circuit.
Figure 2:
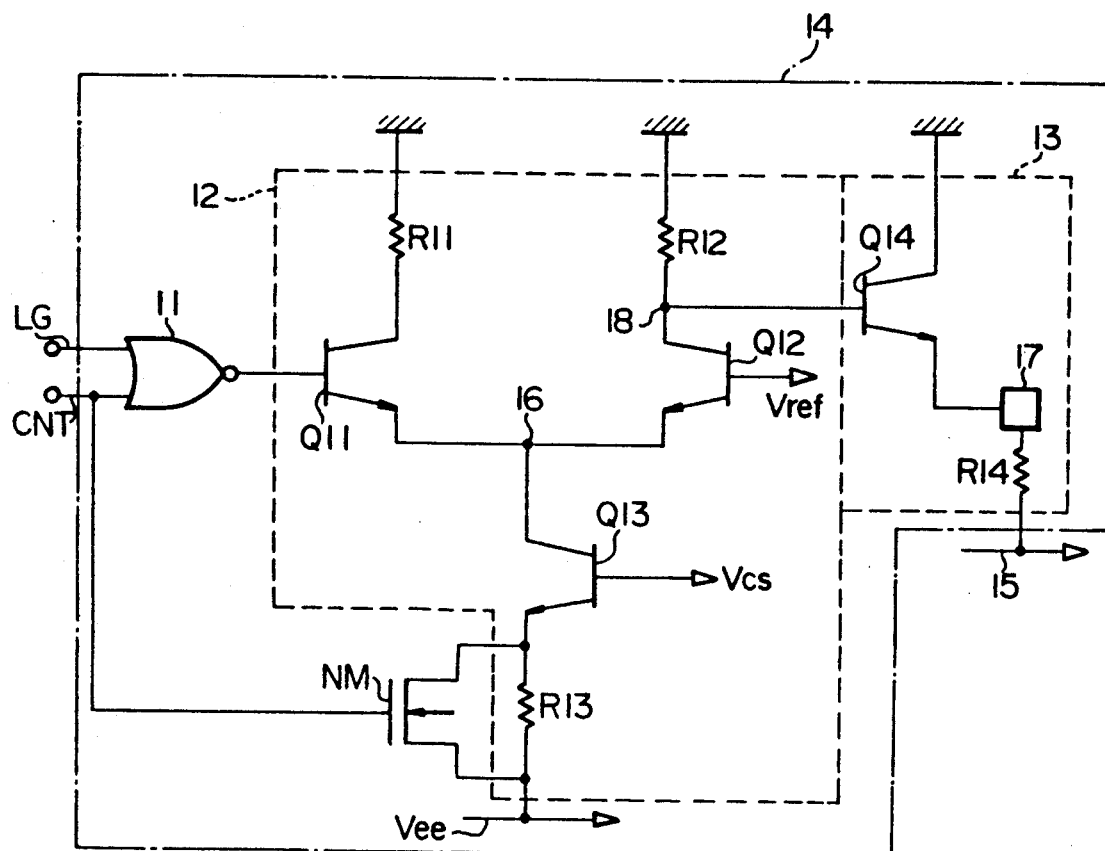
FIG. 2 is a circuit diagram showing the arrangement of a three state emitter coupled logic circuit embodying the present invention.

Referring first to FIG. 2 of the drawings, a three state emitter coupled logic circuit according to the first embodiment of the present invention largely comprises a logic circuit implemented by a NOR gate 11, a difference circuit 12, an output circuit 13, and a bypassing circuit implemented by an n-channel type field effect transistor NM. The three state emitter coupled logic circuit is fabricated on a semiconductor chip 14, and is coupled to an output signal line 15 of a multi-bit bus system which is provided in association with other electronic circuits so as to form in combination an electronic system. The output signal line 15 is coupled to an end voltage level source or a negative low voltage level However, the output line 15 may be provided on the semiconductor chip where the emitter coupled logic circuit is fabricated.

The difference circuit 12 has a first series combination of a first resistor R11 and a first n-p-n bipolar transistor Q11 coupled between a ground node and a common node 16, a second series combination of a second resistor R12 and a second n-p-n bipolar transistor Q12 coupled between the ground node and the common node 16 in parallel to the first series combination, and a third series combination of a third n-p-n bipolar transistor Q13 and a third resistor R13 coupled between the common node and a negative constant voltage source Vee. The first n-p-n bipolar transistor Q11 is supplied at the base node thereof with an internal logic signal fed from the NOR gate 11, and a reference voltage level Vref is supplied to the base node of the second n-p-n bipolar transistor Q12. Since the reference voltage level Vref is selected in such a manner that the second n-p-n bipolar transistor Q12 turns on and off in the opposite fashion to the first n-p-n bipolar transistor Q11 depending upon the voltage level of the internal logic signal, the first and second n-p-n bipolar transistors Q11 and Q12 complementarily turn on and off for achievement of a difference function.

The output circuit 13 is formed by a series combination of a fourth n-p-n bipolar transistor Q14, an output node 17 and a fourth resistor R14, and the fourth n-p-n bipolar transistor Q14 is coupled at the base node thereof to an intermediate node 18 between the second resistor R12 and the second n-p-n bipolar transistor Q12. The bypassing circuit or the n-channel type field effect transistor NM is coupled in parallel to the third resistor R13, and the n-channel type field effect transistor NM is supplied at the gate electrode thereof with the three state control signal CNT. The bypassing circuit thus coupled is responsive to the three state control signal CNT, and provides a current path between the third n-p-n bipolar transistor Q13 and the negative constant voltage source Vee. The fourth n-p-n bipolar transistor Q14 selectively increases or decreases the collector current thereof depending upon the voltage level at the intermediate node 18 in a logic function mode of operation; however, the fourth n-p-n bipolar transistor Q14 is surely maintained in the off state with an extremely low voltage level at the intermediate node 18. Namely, if the intermediate node 18 is shifted between the ground voltage level (or a high voltage level) and a negative voltage level (or a low voltage level) depending upon the state of the second n-p-n bipolar transistor Q12, the three state emitter coupled logic circuit is established into the logic function mode, and, accordingly, the fourth n-p-n bipolar transistor Q14 increases or decreases the collector current thereof for providing an output signal of either high or low voltage level at the output node 17. In this instance, the collector current of the fourth n-p-n bipolar transistor Q14 is varied between about 20 milli-ampere and about 5 milli-ampere, and, accordingly, the output signal swings the voltage level thereof between about −0.9 volt and about −1.7 volt. However, if the n-channel type field effect transistor NM turns on to provide the current path, the intermediate node 18 is decreased in voltage level toward the extremely low voltage level due to a large amount of current increased, and the fourth n-p-n bipolar transistor Q14 can not turn on. This means that the three state emitter coupled logic circuit is established into the high impedance state. For maintaining the fourth n-p-n bipolar transistor in the off state, it is necessary that the extremely low voltage level is lower than the total sum of the end voltage level and the forwardly biassed base emitter voltage level of the fourth n-p-n bipolar transistor Q14, and this adjustment is achieved by selecting the transistor size or the gate width of the n-channel type field effect transistor NM.

In operation, if the three state control signal CNT goes down to an inactive low voltage level, the NOR gate 11 produces the internal logic signal opposite in voltage level to the input logic signal. Moreover, the n-channel type field effect transistor NM remains in the off state with the three state control signal of the inactive low voltage level In this situation, when the input logic signal goes up to the high voltage level, the internal logic signal of the low voltage level allows the first n-p-n bipolar transistor Q11 to turn off, which increases the difference voltage between the base and emitter nodes of the second n-p-n bipolar transistor Q12. The difference voltage thus increased allows the second n-p-n bipolar transistor Q12 to turn on so that the low voltage level appears at the intermediate node 18. With the low voltage level, the fourth n-p-n bipolar transistor Q14 decreases the collector current thereof, and, accordingly, the output signal is shifted to the negative low voltage level of about −1.7 volt. However, if the input logic signal LG is recovered to the low voltage level, the internal logic signal of the high voltage level allows the first n-p-n bipolar transistor Q11 to turn on, and the second n-p-n bipolar transistor Q12 turns off due to decrement in voltage level between the base and emitter nodes of the second n-p-n bipolar transistor Q12. This results in that the intermediate node 18 is increased in voltage level, and, accordingly, the forth n-p-n bipolar transistor Q14 increases the collector current thereof. As a result, the output signal at the node 17 is shifted to the high voltage level of about −0.9 volt. Thus, the three state emitter coupled logic circuit carries out the logical function in the presence of the three state control signal CNT of the inactive low voltage level, and the logical function is of the inverting operation.

If, on the other hand, the three state control signal goes down to the active high voltage level, the NOR gate never respond to the input logic signal LG, and the internal logic signal remains in the low voltage level. This results in that the first n-p-n bipolar transistor Q11 is maintained in the off state. On the other hand, the n-channel type field effect transistor NM turns on to provide the additional current path, and, for this reason, the amount of the current passing through the third n-p-n bipolar transistor Q13. The first n-p-n bipolar transistor Q11 in the off state causes the second n-p-n bipolar transistor Q12 to turn on, and the current increased by the n-channel type field effect transistor NM decreases the voltage level at the intermediate node 18 due to the second resistor R12. When the intermediate node 18 reaches the extremely low voltage level, the fourth n-p-n bipolar transistor Q14 never turns on, and the three state emitter coupled logic circuit is established in the high impedance state.

Figure 3:
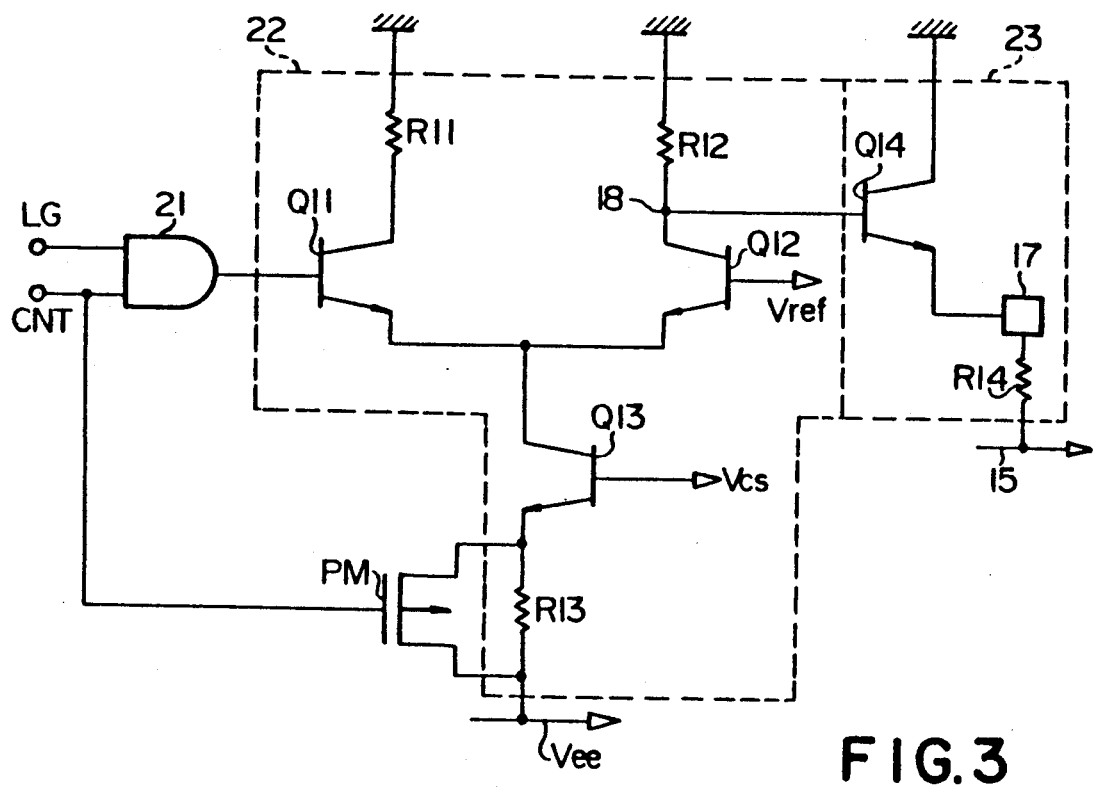
FIG. 3 is a circuit diagram showing the arrangement of another three state emitter coupled logic circuit embodying the present invention.

Turning to FIG. 3 of the drawings, another embodiment of the three state emitter coupled logic circuit according to the present invention largely comprises a logic circuit implemented by an AND gate 21, a difference circuit 22, an output circuit 23, and a bypassing circuit implemented by a p-channel type field effect transistor PM. However, the three state emitter coupled logic circuit shown in FIG. 3 is similar in circuit arrangement to the circuit shown in FIG. 2 with the exception of the logic circuit and the bypassing circuit, and, for this reason, the component elements of the other circuits are designated by like reference numerals used in FIG. 2 without detailed description.

Since the bypassing circuit is formed by the p-channel type field effect transistor PM, the three state control signal CNT shifts the voltage level thereof between an active low level and an inactive high level. Namely, when the three state control signal CNT goes up to the inactive high voltage level, the AND gate produces an internal logic signal identical in voltage level with an input logic signal LG; however, if the three state control signal CNT goes down to the active low voltage level, the AND gate 21 produces the internal logic signal of the low voltage level regardless of the input logic signal LG. The three state control signal of the active low voltage level allows the p-channel type field effect transistor PM to turn on to provide an additional current path between the third n-p-n bipolar transistor Q13 and the negative constant voltage source Vee. When the additional current path is established, a large amount of current flows through the second n-p-n bipolar transistor Q12, and the voltage level at the intermediate node 18 is lowered due to the second resistor R12.

In the logic function mode of operation, the output circuit 23 produces the output signal identical in logic level with the input logic signal LG, and the non-inverted function is achieved by the three state emitter coupled logic circuit shown in FIG. 3.

Figure 4:
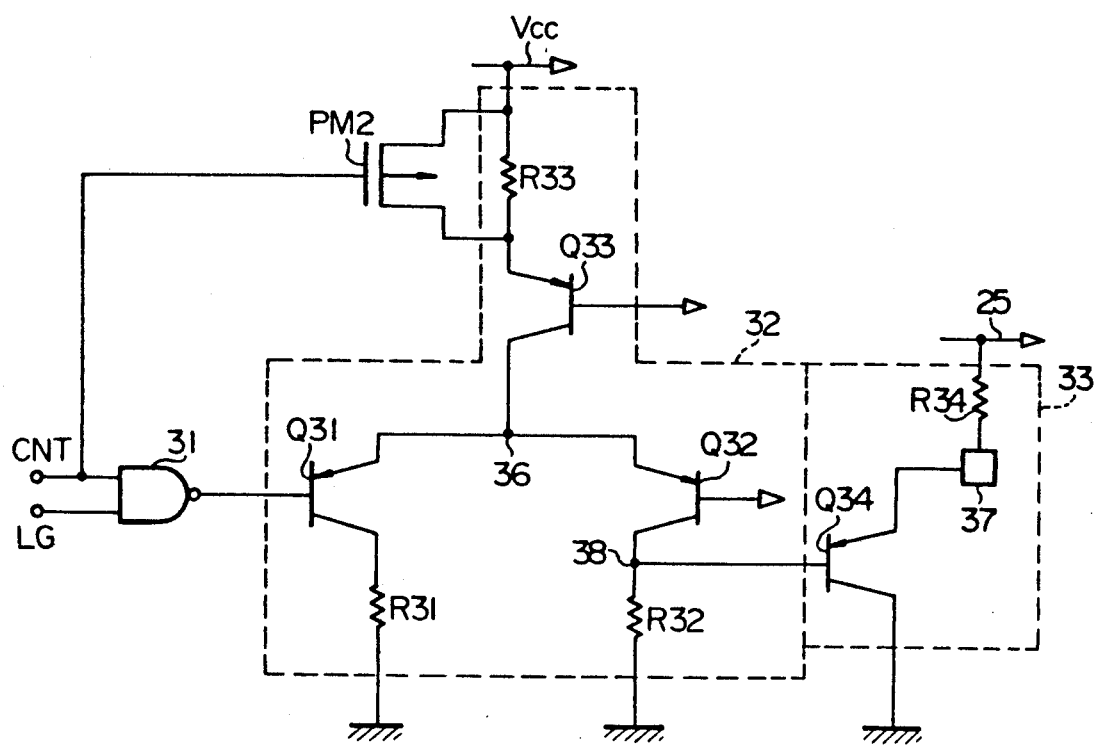
FIG. 4 is a circuit diagram showing the arrangement of still another three state emitter coupled logic circuit embodying the present invention.

Turning to FIG. 4 of the drawing, still another embodiment of the three state emitter coupled logic circuit embodying the present invention is illustrated. The three state emitter coupled logic circuit shown in FIG. 4 largely comprises a logic circuit implemented by a NAND gate 31, a difference circuit 32, an output circuit 33 and a bypassing circuit implemented by a p-channel type field effect transistor PM2. The three state emitter coupled logic circuit is coupled to an output signal line 25 of a multi-bit bus system which is provided in association with other electronic circuits so as to form in combination an electronic system. The output signal line 55 is terminated to an end voltage level source or a positive low voltage level.

The difference circuit 32 has a first series combination of a first resistor R31 and a first p-n-p bipolar transistor Q31 coupled between a ground node and a common node 36, a second series combination of a second resistor R32 and a second p-n-p bipolar transistor Q32 coupled between the ground node and the common node 36 in parallel to the first series combination, and a third series combination of a third p-n-p bipolar transistor Q33 and a third resistor R33 coupled between the common node 36 and a positive constant voltage source Vcc. The first p-n-p bipolar transistor Q31 is supplied at the base node thereof with an internal logic signal fed from the NAND gate 11, and a reference voltage level Vref is supplied to the base node of the second p-n-p bipolar transistor Q32. Since the reference voltage level Vref is selected in such a manner that the second p-n-p bipolar transistor Q32 turns on and off in the opposite fashion to the first p-n-p bipolar transistor Q31 depending upon the voltage level of the internal logic signal, the first and second p-n-p bipolar transistors Q31 and Q32 complementarily turn on and off for achievement of a difference function.

The output circuit 33 is formed by a series combination of a fourth p-n-p bipolar transistor Q34, an output node 37 and a fourth resistor R34, and the fourth p-n-p bipolar transistor Q34 is coupled at the base node thereof to an intermediate node 38 between the second resistor R32 and the second p-n-p bipolar transistor Q32. The bypassing circuit or the p-channel type filed effect transistor PM2 is coupled in parallel to the third resistor R33, and the p-channel type field effect transistor PM2 is supplied at the gate electrode thereof with the three state control signal CNT. The bypassing circuit thus coupled is responsive to the three state control signal CNT, and provides an additional current path between the third p-n-p bipolar transistor Q33 and the positive constant voltage source Vcc. The fourth p-n-p bipolar transistor Q34 increases or decreases the collector current thereof depending upon the voltage level at the intermediate node 38 in a logic function mode of operation; however, the fourth p-n-p bipolar transistor Q34 is surely maintained in the off state with an extremely low voltage level at the intermediate node 38. Namely, if the intermediate node 38 is shifted between the ground voltage level (or a low voltage level) and a positive voltage level (or a high voltage level) depending upon the state of the second p-n-p bipolar transistor Q32, the three state emitter coupled logic circuit is established into the logic function mode, and, accordingly, the fourth p-n-p bipolar transistor Q34 increases or decreases the collector current thereof for providing an output signal of either high or low voltage level at the output node 37. However, if the p-channel type field effect transistor PM2 turns on to provide the current path, the intermediate node 38 is increased in voltage level toward the extremely high voltage level due to a large amount of current increased, and the fourth p-n-p bipolar transistor Q34 can not turn on. Then, the three state emitter coupled logic circuit is established into the high impedance state. For maintaining the fourth p-n-p bipolar transistor Q34 in the off state, it is necessary that the extremely high voltage level is higher than the total sum of the positive end voltage level and the forwardly biassed base emitter voltage level of the fourth p-n-p bipolar transistor Q34, and this adjustment is achieved by selecting the transistor size or the gate width of the p-channel type field effect transistor PM2.

The three state emitter logic coupled circuit thus arranged achieves an inverting operation; however, the circuit behavior is similar to that of the circuit shown in FIG. 2, so that no further description is made in detail for the sake of simplicity.

Figure 5:
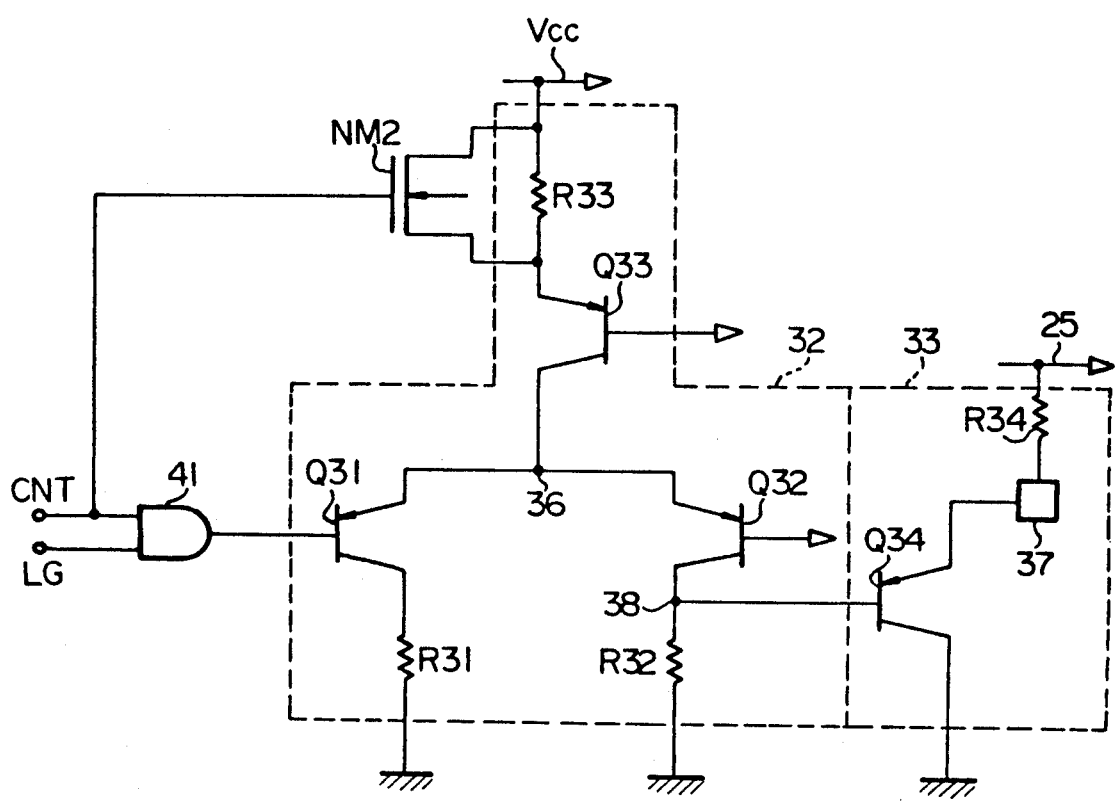
FIG. 5 is a circuit diagram showing the arrangement of still another three state emitter coupled logic circuit embodying the present invention.

FIG. 5 illustrates a further embodiment of the three state emitter coupled logic circuit embodying the present invention, and the circuit arrangement is similar to that of the circuit shown in FIG. 4 with the exception of the bypassing circuit and the logic circuit. In this instance, the logic circuit is implemented by an AND gate 41 instead of the NAND gate 31, and the p-channel type field effect transistor PM2 is replaced with an n-channel type field effect transistor NM2. By virtue of this replacement, the three state emitter coupled logic circuit shown in FIG. 5 achieves a non-inverting function or a through function; however, the circuit behavior is similar to the circuit shown in FIG. 4. The component elements of the other circuits are designated by like reference numerals used in FIG. 4, and no further description is incorporated for the sake of simplicity.

The active voltage levels of the three state control signals CNT are different between the first embodiment and the other embodiments; however, the active levels may be standardized by using, for example, an inverter circuit.

As will be understood from the foregoing description, the three state emitter coupled logic circuit according to the present invention is advantageous over the prior art in that no additional current flows through the bypassing circuit in the logic function mode of operation, and, for this reason, the total amount of current consumed is decreased. Moreover, the bypassing circuit is implemented by only one field effect transistor, so that the number of the component elements is decreased, and, accordingly, the wiring arrangement is simplified in comparison with the prior art example. Since the three state emitter coupled logic circuit according to the present invention is simple in arrangement, the circuit occupies a relatively small amount of area and, for this reason, is desirable for an integrated circuit.

Although particular embodiments of the present invention have been shown and described, it will be obvious to those skilled in the art that various changes and modifications may be made without departing from the spirit and scope of the present invention. For example, the field effect transistors are used for implementing the bypassing circuits; however, bipolar transistor may be used for the bypassing circuit. Moreover, the bypassing circuit aims at increasing the amount of the current flowing through the difference circuit, and, for this reason, may interconnect the common node and the constant voltage source for providing a bypassing path of the third series combination per se.

What is claimed is:

1. A three state emitter coupled logic circuit shifted between a logical function mode and a high impedance state, comprising:
   (a) a logic circuit responsive to an input logic signal and a three state control signal and operative to produce an internal logic signal;
   (b) a difference circuit having a first series combination of a first resistor and a first bipolar transistor coupled between a first constant voltage source and a common mode, a second series combination of a second resistor and a second bipolar transistor coupled in parallel to the first series combination between the first constant voltage source and the common node, a third series combination of a third bipolar transistor and a third resistor coupled between the common node and a second constant voltage source, said first, second and third bipolar transistors being supplied at the respective base nodes thereof with the internal logic signal, a reference voltage level and a current source signal, respectively;
   (c) an output circuit having a fourth series combination of a fourth bipolar transistor, an output node and a fourth resistor coupled between the first constant voltage source and an output signal line, said fourth bipolar transistor being coupled at the base node thereof to an intermediate node provided between said second bipolar transistor and said second resistor; and
   (d) a bypassing circuit providing a current path bypassing said third resistor in the presence of said three state control signal of an active voltage level for establishing said three state emitter coupled logic circuit in said high impedance state, said current path being blocked in the presence of said three state control signal of an inactive voltage level for establishing said three state emitter coupled logic circuit in said logic function mode, said first constant voltage source and said second constant voltage source respectively producing a ground voltage level and a negative voltage level.
   wherein said first, second, third and fourth bipolar transistors are of the n-p-n type and said bypassing circuit is formed by an n-channel type field effect transistor having a gate electrode supplied with said three state control signal.

2. A three state emitter coupled logic circuit as set forth in claim 1, wherein said logic circuit is implemented by a NOR gate.

3. A three state emitter coupled logic circuit as set forth in claim 1, wherein said bypassing circuit is formed by a p-channel type field effect transistor having a gate electrode supplied with the three state control signal.

4. A three state emitter coupled logic circuit as set forth in claim 3, wherein said logic circuit is implemented by an AND gate.

5. A three state emitter coupled logic circuit shifted between a logical function mode and a high impedance state, comprising:
   (a) a logic circuit responsive to an input logic signal and a three state control signal and operative to produce an internal logic signal;
   (b) a difference circuit having a first series combination of a first resistor and a first bipolar transistor coupled between a first constant voltage source and a common node, a second series combination of a second resistor and a second bipolar transistor coupled in parallel to the first series combination between the first constant voltage source and the common node, a third series combination of a third bipolar transistor and a third resistor coupled between the common node and a second constant voltage source, said first, second and third bipolar transistors being supplied at the respective base nodes thereof with the internal logic signal, a reference voltage level and a current source signal, respectively;
   (c) an output circuit having a fourth series combination of a fourth bipolar transistor, an output node and a fourth resistor coupled between the first constant voltage source and an output signal line, said fourth bipolar transistor being coupled at the base node thereof to an intermediate node provided between said second bipolar transistor and said second resistor; and
   (d) a bypassing circuit providing a current path bypassing said third resistor in the presence of said three state control signal of an active voltage level for establishing said three state emitter coupled logic circuit in said high impedance state, said current path being blocked in the presence of said three state control signal of an inactive voltage level for establishing said three state emitter coupled logic circuit in said logic function mode, said first and second constant voltage sources respectively producing a positive voltage level and a ground voltage level,
   wherein said first, second, third and fourth bipolar transistors are of the p-n-p type and said bypassing circuit is formed of a p-channel type field effect transistor.

6. A three state emitter coupled logic circuit as set forth in claim 5 wherein said logic circuit is of the NAND gate.

7. A three state emitter coupled logic circuit shifted between a logical function mode and a high impedance state, comprising:
   (a) a logic circuit responsive to an input logic signal and a three state control signal and operative to produce an internal logic signal;
   (b) a difference circuit having a first series combination of a first resistor and a first bipolar transistor coupled between a first constant voltage source and a common node, a second series combination of a second resistor and a second bipolar transistor coupled in parallel to the first series combination between the first constant voltage source and the common node, a third series combination of a third bipolar transistor and a third resistor coupled between the common node and a second constant voltage source, said first, second and third bipolar transistors being supplied at the respective base nodes thereof with the internal logic signal, a reference voltage level and a current source signal, respectively;

(c) an output circuit having a fourth series combination of a fourth bipolar transistor, an output node and a fourth resistor coupled between the first constant voltage source and an output signal line, said fourth bipolar transistor being coupled at the base node thereof to an intermediate node provided between said second bipolar transistor and said second resistor; and (d) a bypassing circuit providing a current path bypassing said third resistor in the presence of said three state control signal of an active voltage level for establishing said three state emitter coupled logic circuit in said high impedance state, said current path being blocked in the presence of said three state control signal of an inactive voltage level for establishing said three state emitter coupled logic circuit in said logic function mode, said first and second constant voltage sources respectively producing a positive voltage level and a ground voltage level, wherein said first, second, third and fourth bipolar transistors are of the p-n-p type and said bypassing circuit is formed of a n-channel type field effect transistor.

8. A three state emitter coupled logic circuit as set forth in claim 7, wherein said logic circuit is implemented by an AND gate.

* * * * *